(12) United States Patent
Harada

(10) Patent No.: US 12,557,310 B2
(45) Date of Patent: Feb. 17, 2026

(54) SEMICONDUCTOR DEVICE AND ELECTRIC POWER CONVERSION DEVICE

(71) Applicant: Mitsubishi Electric Corporation, Tokyo (JP)

(72) Inventor: Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 819 days.

(21) Appl. No.: 17/810,991

(22) Filed: Jul. 6, 2022

(65) Prior Publication Data

US 2023/0170404 A1 Jun. 1, 2023

(30) Foreign Application Priority Data

Dec. 1, 2021 (JP) ................................. 2021-195663

(51) Int. Cl.
*H10D 12/00* (2025.01)
*H10D 62/17* (2025.01)
*H10D 62/832* (2025.01)

(52) U.S. Cl.
CPC ......... *H10D 12/481* (2025.01); *H10D 62/393* (2025.01); *H10D 62/8325* (2025.01)

(58) Field of Classification Search
None
See application file for complete search history.

(56) References Cited

U.S. PATENT DOCUMENTS

| 2011/0309470 A1* | 12/2011 | Grebs ................... H10D 8/051 |
| | | 257/E21.546 |
| 2013/0092978 A1 | 4/2013 | Sugawara et al. |
| 2014/0339600 A1 | 11/2014 | Yoshikawa |
| 2016/0260829 A1 | 9/2016 | Aichinger et al. |
| 2017/0345890 A1* | 11/2017 | Losee ................. H10D 12/031 |
| 2019/0280613 A1* | 9/2019 | Fujii ........................ H10D 8/00 |
| 2019/0312113 A1 | 10/2019 | Chen |
| 2020/0287028 A1* | 9/2020 | Kamibaba ............ H10D 30/668 |

(Continued)

FOREIGN PATENT DOCUMENTS

| CN | 110350023 A | * 10/2019 | ............ H02M 7/003 |
| CN | 113380882 A | * 9/2021 | ........... H10D 84/617 |

(Continued)

OTHER PUBLICATIONS

"Notice of Reasons for Refusal" Office Action issued in JP 2021-195663; mailed by the Japanese Patent Office on Nov. 5, 2024.

(Continued)

*Primary Examiner* — Duy T Nguyen
*Assistant Examiner* — Kenneth Mark Sipling
(74) *Attorney, Agent, or Firm* — Studebaker Brackett PLLC

(57) ABSTRACT

Peak concentration of the carrier accumulation layer is equal to or higher than $1.0E16/cm^3$. A bottom part of the trench is positioned inside the n-type carrier accumulation layer. When a concentration ratio is a result of division of a concentration of the carrier accumulation layer by a concentration of the drift layer at a depth of the bottom part of the trench, the depth of the bottom part of the trench is a position at which the concentration ratio is larger than one and equal to or smaller than 10.

9 Claims, 6 Drawing Sheets

(56) References Cited

U.S. PATENT DOCUMENTS

| | | | |
|---|---|---|---|
| 2020/0312955 A1* | 10/2020 | Kubo | H10D 84/143 |
| 2021/0151588 A1* | 5/2021 | Nagata | H10D 64/117 |
| 2021/0151590 A1* | 5/2021 | Oshino | H10D 12/038 |
| 2021/0202724 A1* | 7/2021 | Rahimo | H10D 62/107 |
| 2021/0265340 A1* | 8/2021 | Mitsuzuka | H10D 64/117 |

FOREIGN PATENT DOCUMENTS

| | | |
|---|---|---|
| JP | 2013-089700 A | 5/2013 |
| JP | 2016-163049 A | 9/2016 |
| JP | 2019-186318 A | 10/2019 |
| WO | 2013/136898 A1 | 9/2013 |

OTHER PUBLICATIONS

"Decision of Refusal" Office Action issued in JP 2021-195663; mailed by the Japanese Patent Office on Jan. 28, 2025.

\* cited by examiner

SEMICONDUCTOR DEVICE AND ELECTRIC POWER CONVERSION DEVICE

BACKGROUND OF THE INVENTION

Field

The present disclosure relates to a semiconductor device and an electric power conversion device.

Background

A semiconductor device for electric power includes a carrier accumulation layer and a trench gate structure to reduce on-voltage. In a conventional semiconductor device, a trench has been formed to penetrate through the carrier accumulation layer (refer to JP2013-89700A, for example).

SUMMARY

There has been a problem that capacitance characteristics increase as trench depth increases. In addition, there has been another problem that withstand voltage decreases at the time of reverse bias application when a trench gate is simply provided in the carrier accumulation layer.

The present disclosure is intended to solve the above-described problems and obtain a semiconductor device and an electric power conversion device that can reduce increase of capacitance characteristics without causing withstand voltage decrease.

A semiconductor device according to the present disclosure includes: a semiconductor substrate including a drift layer of a first conductivity type provided between a first principal surface and a second principal surface facing to each other; a carrier accumulation layer of the first conductivity type provided on the first principal surface side of the drift layer; a base layer of a second conductivity type provided on the first principal surface side of the carrier accumulation layer; an emitter layer of the first conductivity type selectively provided on the first principal surface side of the base layer; a plurality of trenches arranged on the first principal surface of the semiconductor substrate and penetrating through the emitter layer and the base layer; a gate electrode provided in the trench through a gate insulating film; and a collector layer of the second conductivity type provided on a surface layer of the semiconductor substrate on the second principal surface side, wherein peak concentration of the carrier accumulation layer is equal to or higher than $1.0E16/cm^3$, a bottom part of the trench is positioned inside the n-type carrier accumulation layer, and when a concentration ratio is a result of division of a concentration of the carrier accumulation layer by a concentration of the drift layer at a depth of the bottom part of the trench, the depth of the bottom part of the trench is a position at which the concentration ratio is larger than one and equal to or smaller than 10.

In the present disclosure, the bottom part of the trench is positioned inside the n-type carrier accumulation layer. The depth of the bottom part of the trench is a position at which the concentration ratio is larger than one and equal to or smaller than 10. Thus, it is possible to reduce increase of capacitance characteristics without causing withstand voltage decrease.

Other and further objects, features and advantages of the invention will appear more fully from the following description.

DESCRIPTION OF EMBODIMENTS

A semiconductor device and an electric power conversion device according to the embodiments of the present disclosure will be described with reference to the drawings. The same components will be denoted by the same symbols, and the repeated description thereof may be omitted.

First Embodiment

Figure 1:
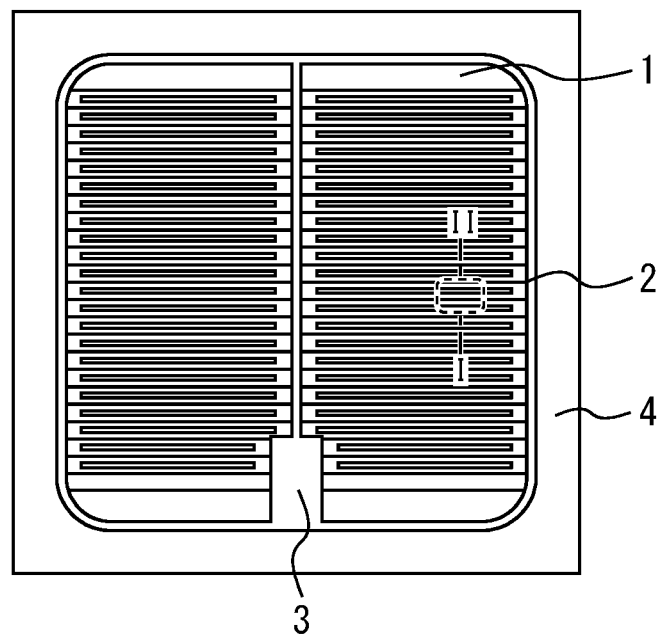
FIG. 1 is a plan view illustrating a semiconductor device according to a first embodiment.

FIG. 1 is a plan view illustrating a semiconductor device according to a first embodiment. A cell region 1 is a region in which main current flows, and includes an IGBT cell. In the cell region 1, a trench 2 is provided in a stripe shape, and a unit cell has a stripe-type plane shape. However, the unit cell may have a lattice-type plane shape made of rectangles, hexagons, or circles, for example.

A gate pad is provided in a pad region 3, but the present disclosure is not limited thereto, and for example, a current sense pad, a Kelvin emitter pad, or a temperature sense diode pad may be provided. The gate pad is a control pad to which gate drive voltage for on-off control of the semiconductor device is applied and that is electrically connected to a gate trench electrode in the cell region. The current sense pad is a control pad for sensing current that flows in the cell region of the semiconductor device and that is electrically connected to part of the cell region so that a current that is between one in several parts to one in several ten-thousandths of the current flowing in the entire cell region flows when current flows in the cell region of the semiconductor device. The Kelvin emitter pad is electrically connected to a p-type base layer of the IGBT cell but may be electrically connected to the p-type base layer through a $p^+$ contact layer. The temperature sense diode pad is a control pad electrically connected to the anode and cathode of a temperature sense diode provided in the semiconductor device. The temperature of the semiconductor device is measured through measurement of voltage between the anode and cathode of a non-illustrated temperature sense diode provided in the cell region.

A terminal end region 4 for holding withstand voltage of the semiconductor device is provided around the cell region 1 and the pad region 3. In the terminal end region 4, for example, a field limiting ring (FLR) in which the cell region 1 is surrounded by p-type terminal end well layers or a variation of lateral doping (VLD) in which the cell region is surrounded by p-type well layers having a concentration gradient is provided as a withstand voltage holding structure on a first principal surface side that is the front surface side of the semiconductor device. The number of ring-shaped p-type terminal end well layers of the FLR or concentration distribution of the VLD is selected as appropriate in accordance with withstand voltage designing of the semiconductor device.

Figure 2:
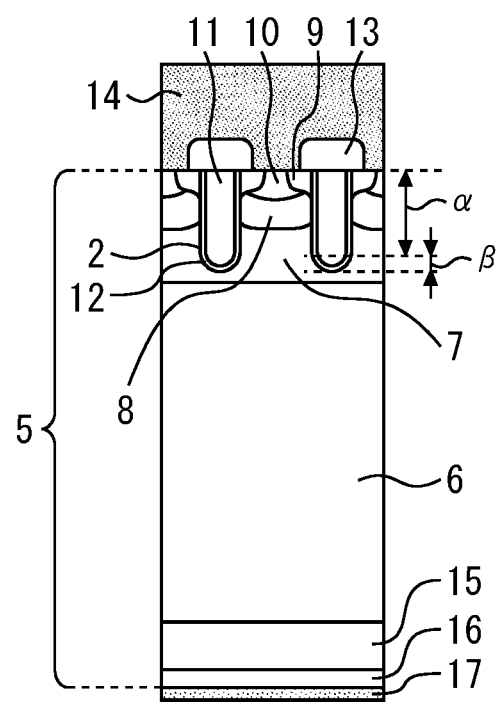
FIG. 2 is a cross-sectional view along I-II in FIG. 1.

FIG. 2 is a cross-sectional view along I-II in FIG. 1. A semiconductor substrate 5 includes a first principal surface and a second principal surface facing to each other, and an $n^-$ drift layer 6 provided between the first principal surface and the second principal surface.

An n-type carrier accumulation layer 7 having an n-type impurity concentration higher than that of the $n^-$ drift layer 6 is provided on the first principal surface side of the $n^-$ drift layer 6. The n-type carrier accumulation layer 7 has a peak concentration equal to or higher than $1.0E16/cm^3$. Since the n-type carrier accumulation layer 7 is provided, a conduction loss when current flows can be reduced. The n-type carrier accumulation layer 7 is formed by performing ion injection of n-type impurities into the semiconductor substrate 5 including the $n^-$ drift layer 6 and thereafter diffusing the injected n-type impurities in the semiconductor substrate 5 by annealing.

A p-type base layer 8 is provided on the first principal surface side of the n-type carrier accumulation layer 7. An n-type emitter layer 9 and a $p^+$ contact layer 10 are selectively provided at part of a surface layer of the p-type base layer 8 on the first principal surface side. A p-type contact layer 10 has an impurity concentration higher than that of the p-type base layer 8.

A plurality of trenches 2 are arranged on the first principal surface of the semiconductor substrate 5 and penetrate through the n-type emitter layer 9 and the p-type base layer 8. A bottom part of each trench 2 is positioned in the n-type carrier accumulation layer 7. A gate electrode 11 is provided in each trench 2 through a gate insulating film 12. An interlayer insulating film 13 covers the upper surface of the gate electrode 11.

An emitter electrode 14 is provided on the first principal surface of the semiconductor substrate 5 and the interlayer insulating film 13. The emitter electrode 14 is an aluminum alloy such as an aluminum silicon alloy (Al—Si alloy). The electrode may be made of a plurality of metal films obtained by forming a plated film on an electrode formed of an aluminum alloy by non-electrolytic plating or electrolytic plating. The plated film is, for example, a nickel (Ni) plated film. When the width of a contact hole provided to the interlayer insulating film 13 is small and favorable embedding is not obtained with the emitter electrode 14, tungsten having more favorable embedding performance than the emitter electrode 14 may be provided in the contact hole and the emitter electrode 14 may be provided on the tungsten.

Note that barrier metal may be provided between the first principal surface of the semiconductor substrate 5 and each of the interlayer insulating film 13 and the emitter electrode 14. The barrier metal is an electric conductor containing titanium (Ti), such as titanium nitride, and may be TiSi as an alloy of titanium and silicon (Si). The barrier metal is electrically connected to the n-type emitter layer 9 and the $p^+$ contact layer 10 through ohmic contact.

An n-type buffer layer 15 having an impurity concentration higher than that of the $n^-$ drift layer 6 is provided on the second principal surface side of the $n^-$ drift layer 6. The n-type buffer layer 15 is provided to reduce punch-through of a depleted layer extending from the p-type base layer 8 to the second principal surface side when the semiconductor device is off. The n-type buffer layer 15 is formed by, for example, injecting phosphorus (P) or proton ($H^+$), and both phosphorus (P) and proton ($H^+$) may be injected. Note that the n-type buffer layer 15 does not necessarily need to be provided.

A p-type collector layer 16 is provided on a surface layer of the semiconductor substrate 5 on the second principal surface side. The p-type collector layer 16 is provided not only in the cell region 1 but also in the terminal end region 4. Part of the p-type collector layer 16 provided in the terminal end region 4 is configured as a p-type terminal end collector layer. A collector electrode 17 is provided on the second principal surface of the semiconductor substrate 5. Similarly to the emitter electrode 14, the collector electrode 17 is made of an aluminum alloy or made of an aluminum alloy and a plated film. The collector electrode 17 may have a configuration different from that of the emitter electrode 14. The collector electrode 17 ohmic-contacts the p-type collector layer 16 and is electrically connected to the p-type collector layer 16.

When a concentration ratio is a result of division of the concentration of the n-type carrier accumulation layer 7 by the concentration of the drift layer 6 at the depth of the bottom part of each trench 2, the depth of the bottom part of the trench 2 is a position at which the concentration ratio is larger than one and equal to or smaller than 10. The depth of the trench 2 is 3.5 um or larger and 5.0 um or smaller.

Figure 3:
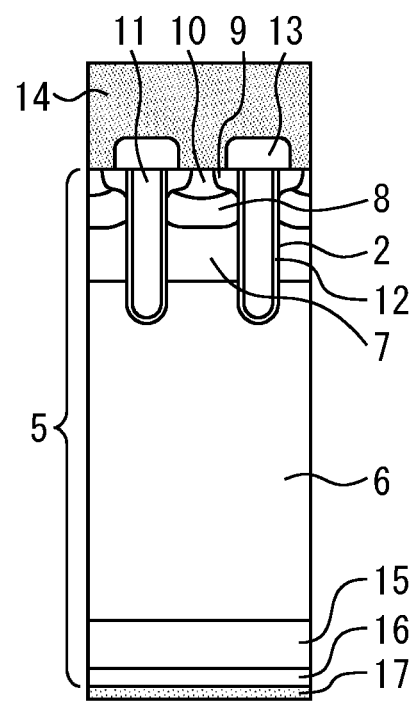
FIG. 3 is a cross-sectional view illustrating a semiconductor device according to the comparative example.

Subsequently, effects of the present embodiment will be described below through comparison with a comparative example. FIG. 3 is a cross-sectional view illustrating a semiconductor device according to the comparative example. In the comparative example, each trench 2 penetrates through the n-type carrier accumulation layer 7 to ensure capacity for reverse bias application-voltage. The trench 2 is deeper than a configuration in which the trench 2 does not penetrate, and accordingly, the perimeter of the trench 2 is longer and capacitance around the gate tends to increase.

Capacitance $C_{ox}$ of the gate insulating film 12 is expressed by $C_{ox}=(\varepsilon_0\varepsilon_{ox}LW)/d$. In the expression, L represents the perimeter of the trench 2, W represents the width (length) of the trench 2, d represents the thickness of the gate insulating film 12, $\varepsilon_0$ represents the dielectric constant in vacuum, and $\varepsilon_{ox}$ represents the specific dielectric constant of the gate insulating film 12. The perimeter L is expressed by $L=2\alpha+\pi\beta$. In the expression, $\alpha$ represents the length of a straight part of the trench 2, and $\beta$ represents the radius of a circumferential part of the trench 2. The values W and d are fixed and thus it is understood that the capacitance $C_{ox}$ of the gate insulating film 12 is determined by the perimeter L of the trench 2.

In the comparative example, since the trench 2 penetrates through the n-type carrier accumulation layer 7, the perimeter L of the trench 2 is long and the capacitance $C_{ox}$ is large. However, in the present embodiment, the bottom part of the trench 2 is positioned inside the n-type carrier accumulation layer 7. Accordingly, the perimeter L of the trench 2 is short, and thus increase of capacitance characteristics can be reduced.

Figure 4:
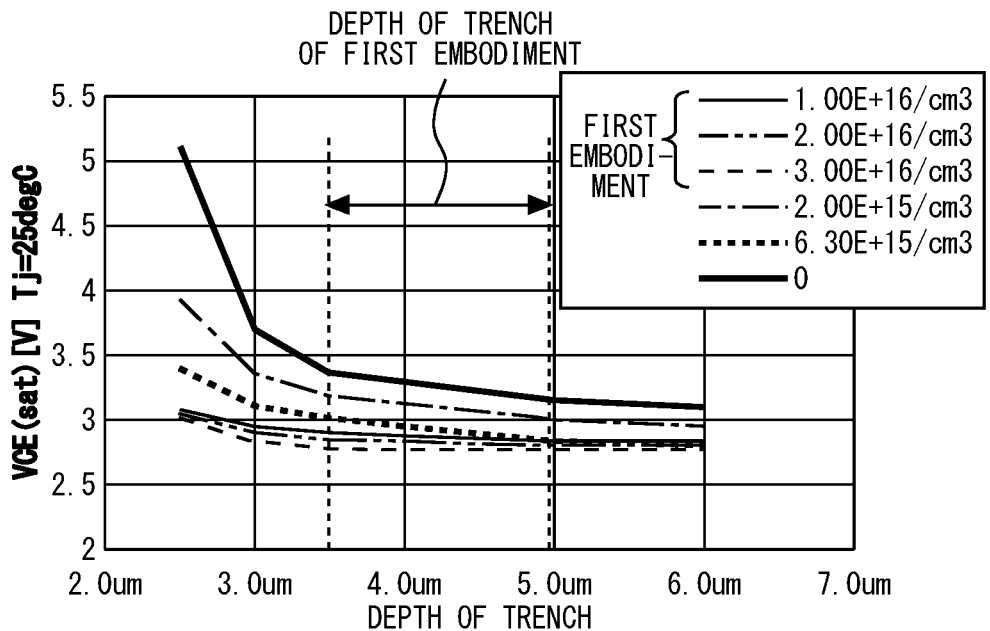
FIG. 4 is a diagram illustrating the correlation between the trench depth and on-voltage for each peak concentration of the carrier accumulation layer.

FIG. 4 is a diagram illustrating the correlation between the trench depth and on-voltage for each peak concentration of the carrier accumulation layer. The on-voltage (VCE(sat)) is a voltage drop when forward bias is applied to the gate electrode 11 to achieve conduction through the collector electrode 17 and the emitter electrode 14. Increase of the on-voltage tends to have high dependency on the depth of the trench 2 when the n-type carrier accumulation layer 7 is not present or the peak concentration of the n-type carrier accumulation layer 7 is lower than $1.0E16/cm^3$. When the peak concentration is lower than $1.0E16/cm^3$, the on-voltage change rate of the example of $6.3E15/cm^3$ having the lowest on-voltage change rate in a range in which the depth of the trench 2 is 3.5 um or larger and 5.0 um or smaller (the ratio of VCE(sat) between the trench depth of 3.5 μm and the trench depth of 5.0 μm) is 10% approximately. However, in the present embodiment, since the peak concentration of the n-type carrier accumulation layer 7 is equal to or higher than $1.0E16/cm^3$, the correlation between the depth of the trench 2 and the on-voltage is gradual.

Figure 5:
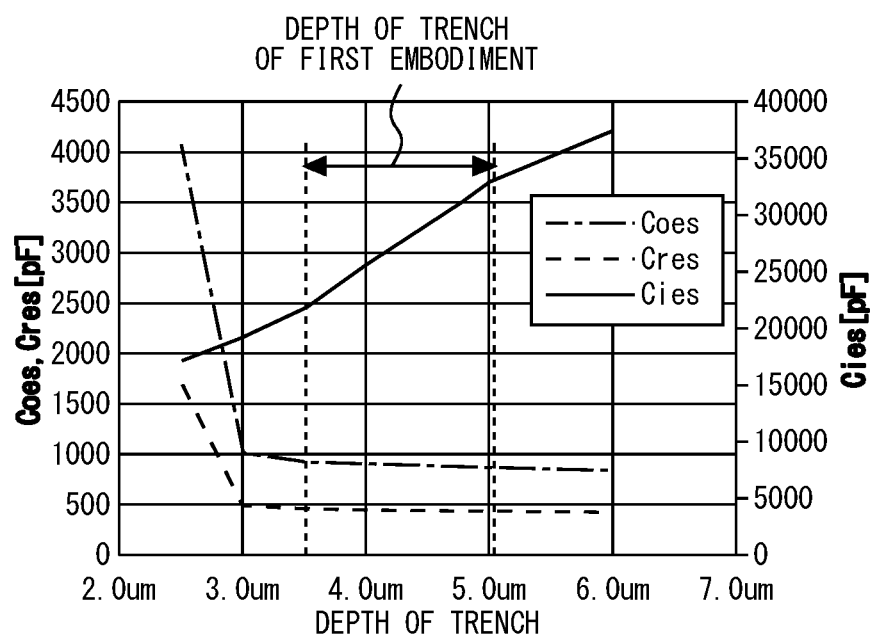
FIG. 5 is a diagram illustrating the correlation between the trench depth and each IGBT capacitance.

FIG. 5 is a diagram illustrating the correlation between the trench depth and each IGBT capacitance. When the depth of the trench 2 is 3.5 um or larger and 5.0 um or smaller, it is possible to prevent abrupt increase of feedback capacitance (Cres) and output capacitance (Coes) and reduce input capacitance (Cies).

Figure 6:
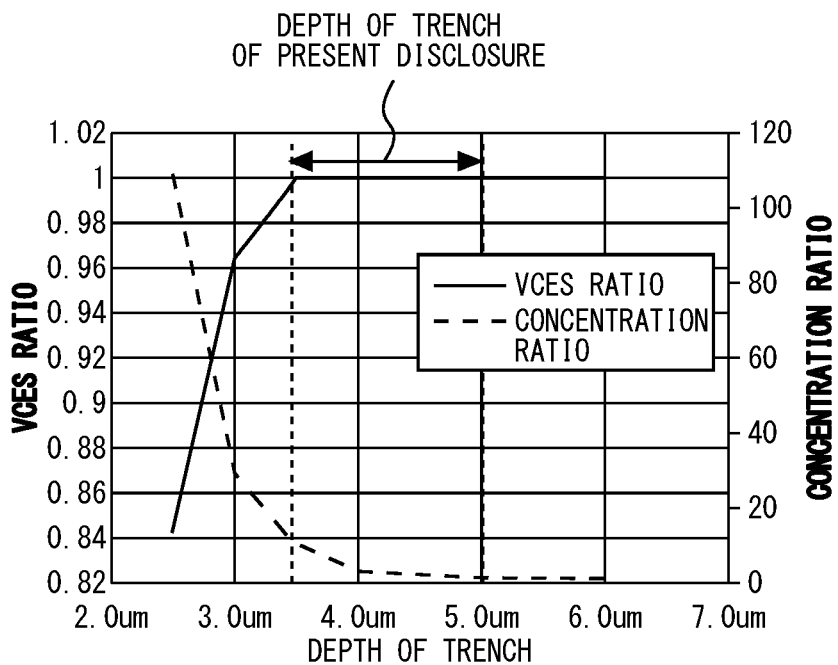
FIG. 6 is a diagram illustrating the correlation between the trench depth and a VCES ratio.

FIG. 6 is a diagram illustrating the correlation between the trench depth and a VCES ratio. VCES represents non-repetition maximum voltage the gate electrode 11 and the emitter electrode 14 are connected to GND and reverse bias applied to the collector electrode 17. The VCES is sufficiently stabilized with a structure in which the trench 2 penetrates through the n-type carrier accumulation layer 7 and the bottom part of the trench 2 is positioned at the n⁻ drift layer 6. The VCES ratio is the ratio of the VCES of a structure in which the depth of the trench 2 is small relative to the VCES of a structure with which the VCES is sufficiently stable (the depth of the trench 2 is 6 μm). The VCES ratio tends to decrease along with the depth of the trench 2 up to the depth of 5.0 um. It is also understood that the VCES ratio is stable in a region in which the concentration ratio is equal to or smaller than 10.

Figure 7:
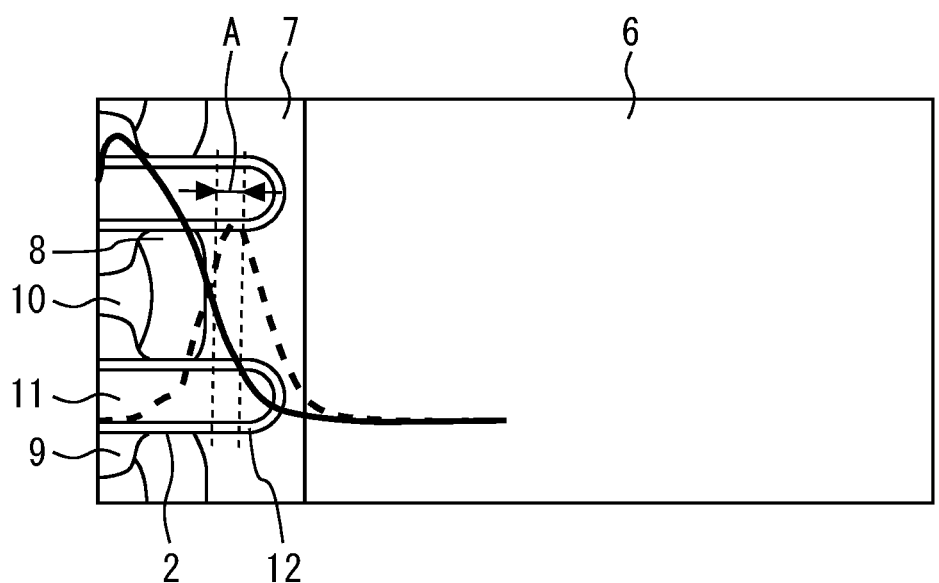
FIG. 7 is a diagram illustrating the relation between carrier concentration distribution of the p-type base layer and carrier concentration distribution of the n-type carrier accumulation layer according to the first embodiment.

FIG. 7 is a diagram illustrating the relation between carrier concentration distribution of the p-type base layer and carrier concentration distribution of the n-type carrier accumulation layer according to the first embodiment. In the figure, A represents the distance from an intersection point between the carrier profile of the p-type base layer 8 (solid line) and the carrier profile of the n-type carrier accumulation layer 7 (dashed line) to the peak concentration of the n-type carrier accumulation layer 7. In other words, A represents the distance from a junction position between the p-type base layer 8 and the n-type carrier accumulation layer 7 to the position of the peak concentration of the n-type carrier accumulation layer 7. When A is large, the depth of the n-type carrier accumulation layer 7 needs to be increased to obtain the concentration ratio of 10 or smaller. As a result, the depth of the trench 2 increases as well, and thus it becomes difficult to reduce capacitance characteristics. Thus, A is preferably equal to or smaller than 0.4 um.

Figure 8:
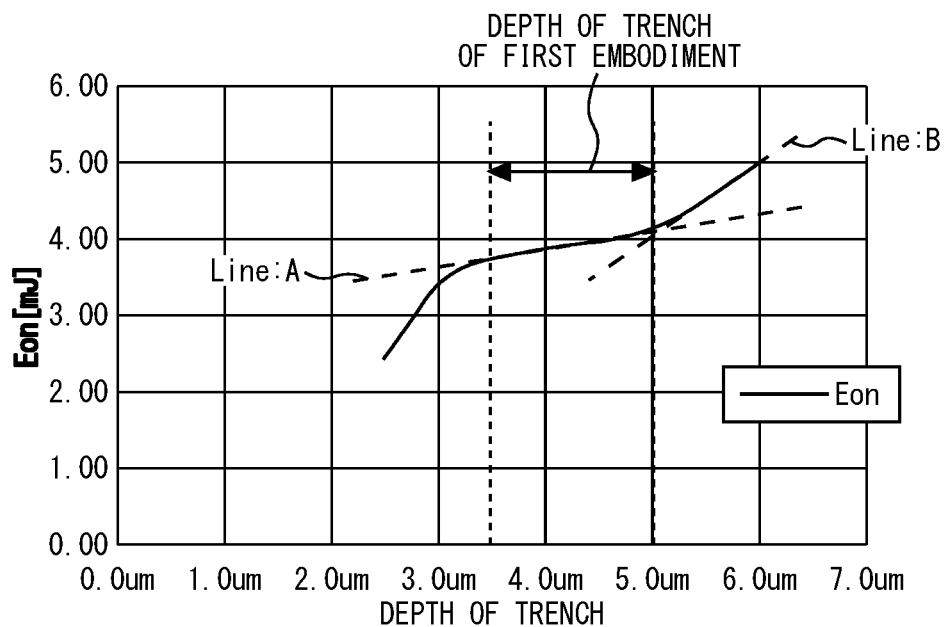
FIG. 8 is a diagram illustrating the correlation between the trench depth and a turn-on loss.

FIG. 8 is a diagram illustrating the correlation between the trench depth and a turn-on loss. The increase rate of the turn-on loss is gradual when the depth of the trench 2 is 3.5 um or larger and 5.0 um or smaller. Line:A is a line that approximates the range in which the correlation between the trench depth and the turn-on loss is gradual. The increase rate of the turn-on loss is steep when the depth of the trench 2 exceeds 5.0 um. Line:B is a line that approximates the range in which the correlation between the trench depth and the turn-on loss is steep. The depth of the trench 2 is 5.0 um at an intersection point between Line:A and Line:B. It is possible to prevent significant increase of the turn-on loss at the time of switching by setting the depth of the trench 2 to 5.0 um or smaller.

Second Embodiment

Figure 9:
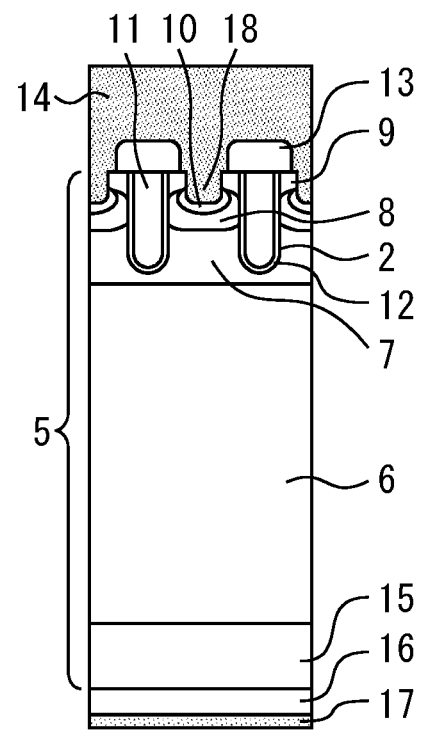
FIG. 9 is a cross-sectional view illustrating a semiconductor device according to a second embodiment.

FIG. 9 is a cross-sectional view illustrating a semiconductor device according to a second embodiment. FIG. 9 corresponds to a section along I-II in FIG. 1. A recessed part 18 penetrating through the n-type emitter layer 9 is selectively provided on a surface layer on the first principal surface side. The recessed part 18 is called a trench contact. Collector current flows through the recessed part 18 but not through the n-type emitter layer 9 at the time of switching of an IGBT in which the p⁺ contact layer 10 is provided at a bottom part of the recessed part 18. Accordingly, latch-up resistance can be improved. Other components and effects are the same as those of the first embodiment.

Third Embodiment

Figure 10:
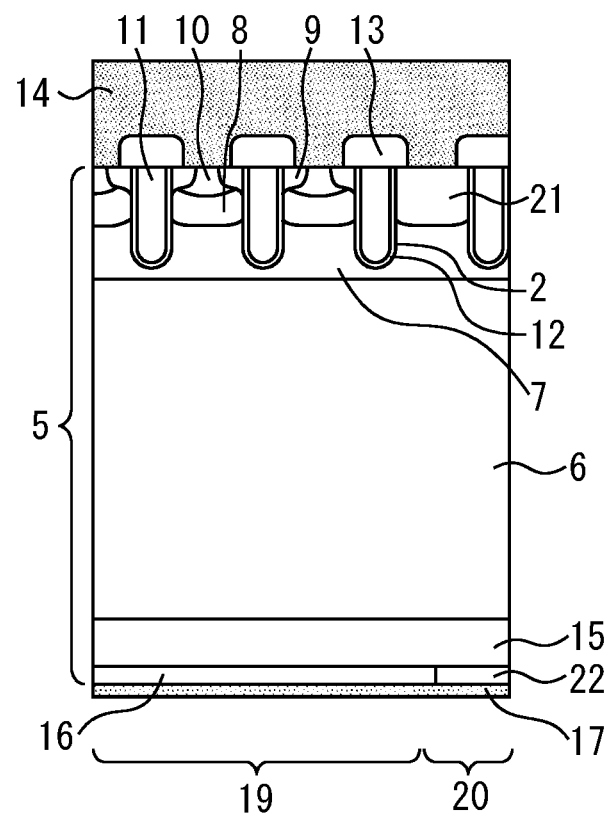
FIG. 10 is a cross-sectional view illustrating a semiconductor device according to a third embodiment.

FIG. 10 is a cross-sectional view illustrating a semiconductor device according to a third embodiment. FIG. 10 corresponds to a section along I-II in FIG. 1. The semiconductor device is an RC-IGBT including an IGBT region 19 and a diode region 20 provided adjacent to each other on the semiconductor substrate 5.

The IGBT region 19 includes the n-type carrier accumulation layer 7, the p-type base layer 8, the n-type emitter layer 9, the trench 2, the gate electrode 11, and the p-type collector layer 16. The diode region 20 includes a p-type anode layer 21 provided on a surface layer of the semiconductor substrate 5 on the first principal surface side, and a n-type cathode layer 22 provided on the surface layer of the semiconductor substrate 5 on the second principal surface side. Other components are same as those of the first embodiment. Accordingly, an RC-IGBT that achieves the effects of the first embodiment can be obtained.

The semiconductor substrate 5 is not limited to a semiconductor substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Fourth Embodiment

In this embodiment, the semiconductor devices according to the first to third embodiments described above are applied to an electric power conversion device. The electric power conversion device is, for example, an inverter device, a converter device, a servo amplifier, or a power supply unit. Although the present disclosure is not limited to a specific electric power conversion device, a case where the present disclosure is applied to a three-phase inverter will be described below.

Figure 11:
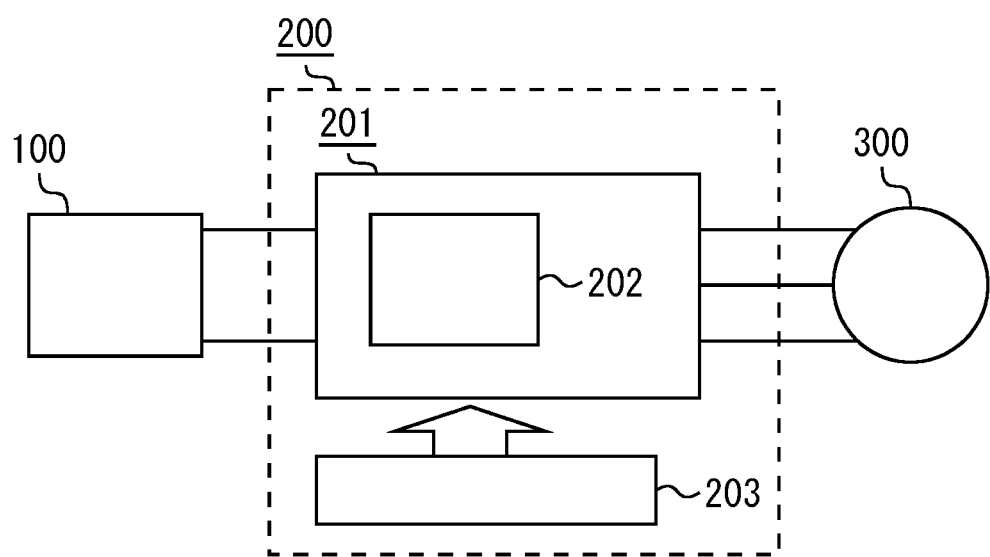
FIG. 11 is a block diagram illustrating a configuration of an electric power conversion system to which the electric power conversion device according to the fourth embodiment is applied.

FIG. 11 is a block diagram illustrating a configuration of an electric power conversion system to which the electric power conversion device according to the fourth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to third embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor devices according to the first to third embodiments are applied as the semiconductor device 202. Accordingly, it is possible to suppress an increase in capacitance characteristics without causing a decrease in withstand voltage.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-195663, filed on Dec. 1, 2021 including specification, claims, drawings and summary, on which the convention priority of the present application is based, is incorporated herein by reference in its entirety.

The invention claimed is:

1. A semiconductor device comprising:
a semiconductor substrate including a drift layer of a first conductivity type provided between a first principal surface and a second principal surface facing to each other;
a carrier accumulation layer of the first conductivity type provided on the first principal surface side of the drift layer;
a base layer of a second conductivity type provided on the first principal surface side of the carrier accumulation layer;
an emitter layer of the first conductivity type selectively provided on the first principal surface side of the base layer;
a plurality of trenches arranged on the first principal surface of the semiconductor substrate and penetrating through the emitter layer and the base layer;
a plurality of gate electrodes provided in the trenches through a plurality of gate insulating films; and
a collector layer of the second conductivity type provided on a surface layer of the semiconductor substrate on the second principal surface side,
wherein peak concentration of the carrier accumulation layer is equal to or higher than $1.0E16/cm^3$,
bottom parts of the trenches are positioned inside the carrier accumulation layer, and
when a concentration ratio is a result of division of a concentration of the carrier accumulation layer by a concentration of the drift layer at a depth of the bottom parts of the trenches, the depths of the bottom parts of the trenches are a position at which the concentration ratio is larger than one and equal to or smaller than 10, and
the concentration of the carrier accumulation layer decreases from a position of peak concentration of the carrier accumulation layer toward the drift layer, and bottom parts of the trenches are positioned between the position of peak concentration of the carrier accumulation layer and the drift layer inside the carrier accumulation layer.

2. The semiconductor device according to claim 1, wherein a distance from a junction position between the base layer and the carrier accumulation layer to a position of peak concentration of the carrier accumulation layer in a direction from the first principal surface to the second principal surface is equal to or smaller than 0.4 um.

3. The semiconductor device according to claim 1, wherein a depth of the trenches is 5.0 um or smaller.

4. The semiconductor device according to claim 1, wherein a depth of the trenches is 3.5 um or larger and 5.0 um or smaller.

5. The semiconductor device according to claim 1, wherein a recessed part penetrating through the emitter layer is selectively provided on a surface layer on the first principal surface side.

6. The semiconductor device according to claim 1, wherein the semiconductor device is an RC-IGBT including an IGBT region and a diode region provided adjacent to each other on the semiconductor substrate,
the IGBT region includes the carrier accumulation layer, the base layer, the emitter layer, the trenches, the gate electrodes, and the collector layer, and
the diode region includes an anode layer of the second conductivity type provided on a surface layer of the semiconductor substrate on the first principal surface side, and a cathode layer of the first conductivity type provided on the surface layer of the semiconductor substrate on the second principal surface side.

7. The semiconductor device according to claim 1, wherein the semiconductor substrate is made of a wide-band-gap semiconductor.

8. An electric power conversion device comprising:
a main conversion circuit including the semiconductor device according to claim 1, converting input power and outputting converted power; and
a control circuit outputting a control signal for controlling the main conversion circuit to the main conversion circuit.

9. The semiconductor device according to claim 1, wherein the peak concentration of the carrier accumulation layer is equal to or less than $3.0E16/cm^3$.

* * * * *